United States Patent
Lin et al.

(10) Patent No.: US 10,636,488 B2
(45) Date of Patent: Apr. 28, 2020

(54) MULTI-SENSING SCAN FOR CROSS-TEMPERATURE MITIGATION

(71) Applicant: WESTERN DIGITAL TECHNOLOGIES, INC., San Jose, CA (US)

(72) Inventors: Lei Lin, San Jose, CA (US); Wei Zhao, San Jose, CA (US); Henry Chin, San Jose, CA (US); Yingda Dong, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/140,236

(22) Filed: Sep. 24, 2018

(65) Prior Publication Data

US 2019/0371402 A1    Dec. 5, 2019

Related U.S. Application Data

(60) Provisional application No. 62/695,746, filed on Jul. 9, 2018, provisional application No. 62/681,048, filed on Jun. 5, 2018.

(51) Int. Cl.
| | |
|---|---|
| *G11C 16/04* | (2006.01) |
| *G11C 16/08* | (2006.01) |
| *G11C 5/06* | (2006.01) |
| *G11C 16/28* | (2006.01) |
| *G11C 11/4097* | (2006.01) |
| *G11C 16/24* | (2006.01) |

(52) U.S. Cl.
CPC .......... *G11C 16/0483* (2013.01); *G11C 5/063* (2013.01); *G11C 11/4097* (2013.01); *G11C 16/08* (2013.01); *G11C 16/24* (2013.01); *G11C 16/28* (2013.01)

(58) Field of Classification Search
CPC .................................................. G11C 11/5642
USPC ..................................................... 365/185.18
See application file for complete search history.

(56) References Cited

U.S. PATENT DOCUMENTS

| | | | |
|---|---|---|---|
| 7,233,538 B1 * | 6/2007 | Wu ........................ | G11C 11/406 365/222 |
| 9,047,954 B2 | 6/2015 | Kamei | |
| 2009/0091979 A1 * | 4/2009 | Shalvi ..................... | G11C 11/56 365/185.09 |
| 2012/0224425 A1 * | 9/2012 | Fai ....................... | G11C 11/5642 365/185.09 |

(Continued)

*Primary Examiner* — Min Huang
(74) *Attorney, Agent, or Firm* — Vierra Magen Marcus LLP

(57) ABSTRACT

Methods and systems for improving the reliability of stored data in the presence of cross-temperature variation are described. To reduce the number of data errors caused by cross-temperature variation, two or more sensing passes may be performed corresponding with two or more different sensing times. The amount of shifting in the memory cell threshold voltages may be determined on a per-bit basis or on a cell-by-cell basis based on the sensing operations performed during the two or more sensing passes. The stored data states may be assigned based on the amount of shifting in the memory cell threshold voltages during the two or more sensing passes and the type of cross-temperature variation present (e.g., whether the memory cells were programmed at a temperature above 65 degrees Celsius and read back at a temperature below 25 degrees Celsius).

20 Claims, 14 Drawing Sheets

(56) References Cited

U.S. PATENT DOCUMENTS

| | | | |
|---|---|---|---|
| 2013/0163346 A1* | 6/2013 | Shen .................. | G11C 16/0483 365/185.24 |
| 2013/0223155 A1* | 8/2013 | Oowada .............. | G11C 11/5642 365/185.22 |
| 2015/0046770 A1* | 2/2015 | Luo .................. | G11C 29/12005 714/764 |

* cited by examiner

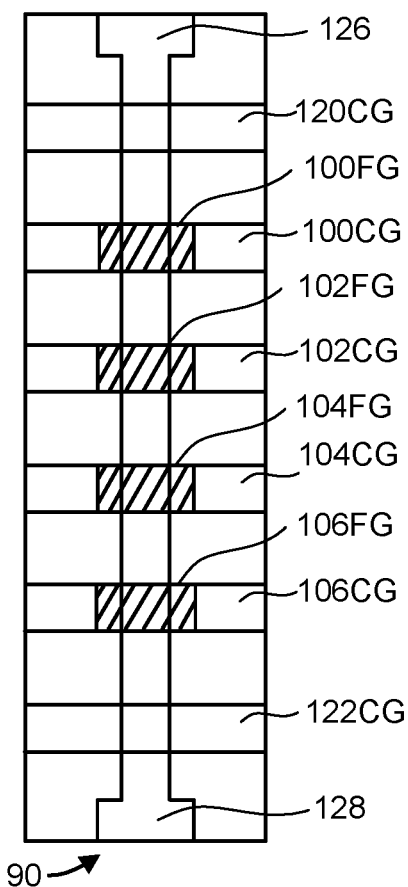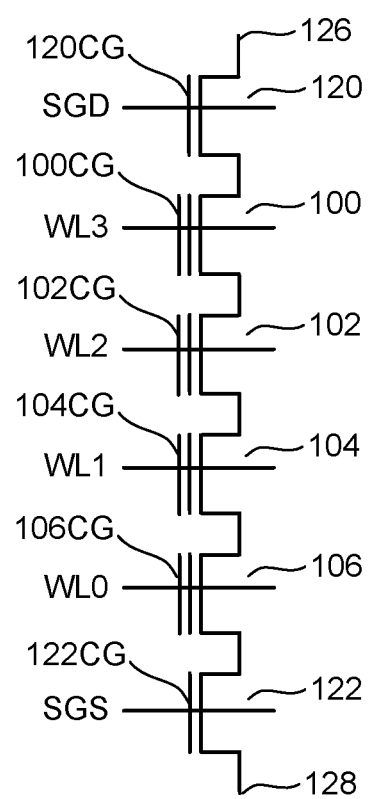
FIG. 1
FIG. 2

US 10,636,488 B2

MULTI-SENSING SCAN FOR CROSS-TEMPERATURE MITIGATION

CLAIM OF PRIORITY

The present application claims priority to U.S. Provisional Application No. 62/695,746, entitled "Multi-Sensing Scan for Cross-Temperature Mitigation," filed Jul. 9, 2018, and to U.S. Provisional Application No. 62/681,048, entitled "Double Sensing Scan for Cross-Temperature Mitigation," filed Jun. 8, 2018, both of which are herein incorporated by reference in their entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (e.g., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in memory cell characteristics over temperature.

BRIEF DESCRIPTION OF THE DRAWINGS

FIG. 1 depicts one embodiment of a NAND string.

FIG. 2 depicts one embodiment of the NAND string of FIG. 1 using a corresponding circuit diagram.

DETAILED DESCRIPTION

Figure 3A:
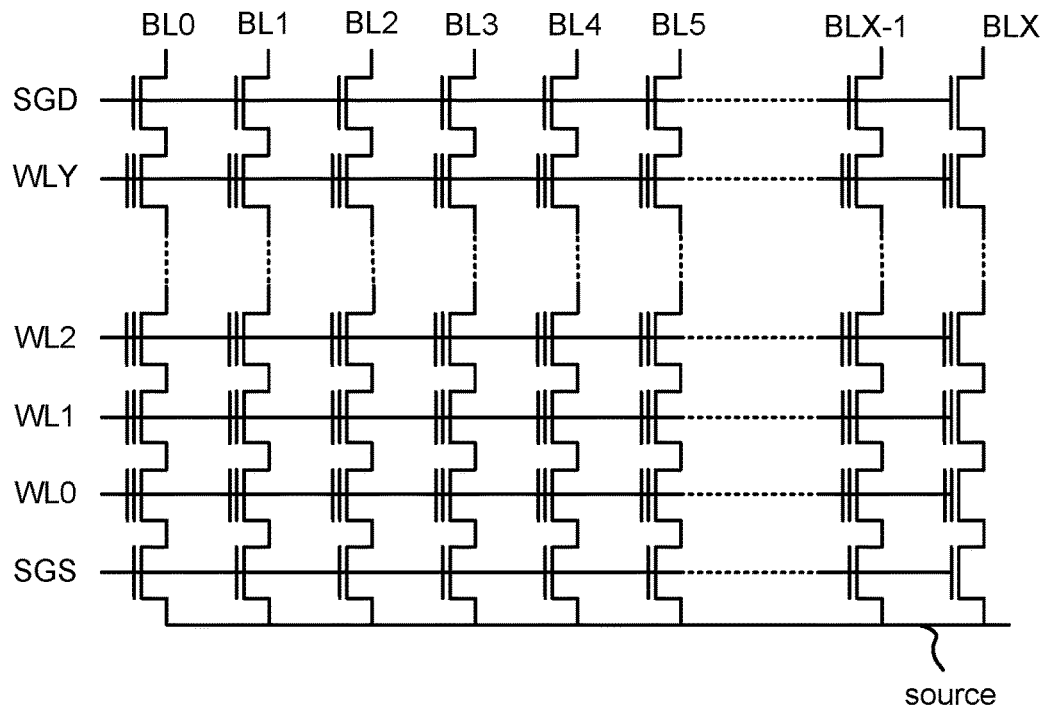
FIG. 3A depicts one embodiment of a memory block including a plurality of NAND strings.

Technology is described for improving the reliability of data stored within a semiconductor memory (e.g., a NAND-type flash memory) over a wide range of operating temperatures. One issue with programming data at a first temperature and then reading back the stored data at a second temperature different from the first temperature is that significant shifts in threshold voltage distributions associated with stored data states may occur due to the cross-temperature variation (or the difference in temperature between when the data was programmed and when the programmed data was read back) leading to corruption of the stored data. To prevent the corruption of the stored data and/or to reduce the number of data errors or the fail bit count caused by the cross-temperature variation, two or more sensing passes may be performed corresponding with two or more different sensing times (or with two or more different sets of sensing conditions).

In one example, a first sensing pass to read the stored data may be performed using a first sensing time (e.g., 1.1 µs) and a second sensing pass to read the stored data may be performed using a second sensing time (e.g., 2.24 µs). The amount of shifting in the sensed memory cell threshold voltages may be determined on a per-bit basis or on a cell-by-cell basis based on the sensing operations performed during the two or more sensing passes. The stored data states may be assigned based on the amount of shifting in the sensed memory cell threshold voltages during the two or more sensing passes and the type of cross-temperature variation present (e.g., whether the memory cells were deemed to have been programmed at a hot temperature and read back at a colder temperature). One benefit of assigning data states for indeterminate data states based on the amount of threshold voltage shifting in the sensed memory cell threshold voltages during two or more sensing passes is that data reliability may be improved and/or the number of bits stored per memory cell may be increased.

During a first sensing pass for sensing a set of memory cells (e.g., corresponding with the memory cell transistors in a NAND string), a first set of sensing conditions may be applied to the set of memory cells. Subsequently, during a second sensing pass for sensing the set of memory cells, a second set of sensing conditions different from the first set of sensing conditions may be applied to the set of memory cells. The first set of sensing conditions may comprise application of a first sensing time (e.g., 1.1 µs), a first bit line voltage (1.25V), and/or a first sensing current (e.g., 500 nA) to the set of memory cells. The second set of sensing conditions may comprise application of a second sensing time (e.g., 2.24 µs), a second bit line voltage (1.5V), and/or a second sensing current (e.g., 800 nA) to the set of memory cells. The sensing conditions may include the bit line bias conditions (e.g., the selected bit line voltages), sensing times (e.g., how long the sensing pulse for a sense amplifier is applied), and/or sensing current loads (e.g., whether an additional sensing current is added during sensing of the memory cells).

In one example, a first sensing pass to read data stored within the set of memory cells may be performed using a first bit line voltage (e.g., 1.25V) and a second sensing pass to read the stored data may be performed using a second bit line voltage (e.g., 1.5V). In this case, the word line voltage (e.g., 3V or another read voltage), the source line voltage, and the sensing times applied to the set of memory cells may be the same or substantially similar during both the first sensing pass and the second sensing pass, but the bit line voltage applied during the sensing of the set of memory cells may be varied. In another example, a first sensing pass to read data stored within the set of memory cells may be performed using a first bit line voltage (e.g., 1.2V) and a first sensing time (1.1 µs) and a second sensing pass to read the stored data may be performed using a second bit line voltage (e.g., 1.4V) and a second sensing time (2.24 µs). In this case, the word line voltage (e.g., 3V) and the source line voltage applied to the set of memory cells may be the same or substantially similar during both the first sensing pass and the second sensing pass, but the bit line voltages and the sensing times applied during the sensing of the set of memory cells may be varied.

A hot temperature may correspond with a temperature above a first threshold temperature, such as 70 degrees Celsius. A cold temperature may correspond with a temperature below a second threshold temperature that is less than the first threshold temperature, such as 20 degrees Celsius. Chip temperature during a read or programming operation may be determined or sensed using an on-chip temperature sensor (e.g., a bandgap-based temperature sensor).

If the amount of shifting in the sensed memory cell threshold voltages towards a lower threshold voltage as the sensing time increases is greater for a lower data state (e.g., the E-state) than a higher data state (e.g., the F-state), then it may be determined that the underlying memory cells were programmed at a first temperature (e.g., 85 degrees Celsius) and read back at a second temperature less than the first temperature (e.g., −25 degrees Celsius); in this case, the memory cells may be deemed to have been programmed at a hot temperature and read back at a cold temperature. However, if the amount of shifting in the sensed memory cell threshold voltages towards a lower threshold voltage as the sensing time increases is greater for a higher data state (e.g., the F-state) than a lower data state (e.g., the E-state), then it may be determined that the underlying memory cells were programmed at the second temperature (e.g., 15 degrees Celsius) and read back at the first temperature greater than the second temperature (e.g., 65 degrees Celsius); in this case, the memory cells may be deemed to have been programmed at a cold temperature and read back at a hot temperature. In some embodiments, the amount of shifting in the sensed memory cell threshold voltages during two or more sensing passes may be used to determine whether the underlying memory cells were programmed at a hot temperature and read back at a cold temperature, were programmed at a cold temperature and read back at a hot temperature, or were programmed and read back at a similar temperature or within a particular temperature range (e.g., between 45 and 65 degrees Celsius).

In some cases, if memory cells are determined to have been programmed at a hot temperature (or a temperature above a first threshold temperature) and read back at a cold temperature (or a temperature below a second threshold temperature less than the first threshold temperature), then larger shifts in threshold voltage distributions may be assigned to lower data states and smaller shifts in threshold voltage distributions may be assigned to higher data states. In one example, if a sensed threshold voltage (or corresponding threshold voltage zone associated with a range of threshold voltages) corresponds with an indeterminate data state (e.g., the sensed threshold voltage corresponds with an overlap between two adjacent data states such as the E-state and the F-state) and the shifting in the threshold voltage is greater than 300 mV (or another voltage shifting threshold such as 200 mV), then the read-back data state may be assigned to a lower data state (e.g., the E-state); however, if the shifting in the threshold voltage is not greater than 300 mV, then the read-back data state may be assigned to a higher data state (e.g., the F-state).

In other cases, if memory cells are determined to have been programmed at a cold temperature (or a temperature below a second threshold temperature less than a first threshold temperature) and read back at a hot temperature (or a temperature above the first threshold temperature), then larger shifts in threshold voltage distributions may be assigned to higher data states and smaller shifts in threshold voltage distributions may be assigned to lower data states. In one example, if a sensed threshold voltage (or corresponding threshold voltage zone) corresponds with an indeterminate data state (e.g., the sensed threshold voltage corresponds with an overlap between the E-state and the F-state) and the shifting in the threshold voltage is greater than 200 mV (or another voltage shifting threshold such as 150 mV), then the read-back data state may be assigned to a higher data state (e.g., the F-state); however, if the shifting in the threshold voltage is not greater than 200 mV, then the read-back data state may be assigned to a lower data state (e.g., the E-state).

In one embodiment, data may be read from a semiconductor memory and upon detecting an ECC error or a bit error in the read data, the one or more bit errors may be fixed by performing two or more sensing passes with different sensing times and then assigning data states for the indeterminate states based on the amount of threshold voltage shifting. Each sensing pass of the two or more sensing passes may oversample the stored data states by identifying a threshold voltage zone for each of the memory cells. The number of zones per data state may comprise a plurality of zones (e.g., there may be three zones or five zones for each data state). The amount of shifting in the threshold voltage zones may be a function of the type of cross-temperature variation; for example, the amount of shifting in the memory cell threshold voltage zones towards a lower threshold voltage zone as the sensing time increases may be greater for a lower data state (e.g., the E-state) than a higher data state (e.g., the F-state) if the underlying memory cells were programmed at a hot temperature and read back at a cold temperature. The number of sensing passes, the determination of the sensing times for each of the sensing passes, and the number of zones may be determined based on the read temperature during the read-back of the stored data (e.g., the number of zones may be increased if the read temperature is below a threshold temperature, such as below 25 degrees Celsius) or the difference between the read temperature and the programming temperature (e.g., the number of zones may be increased from three to five if there has been more than a 50 degree difference between the read-back temperature and the programming temperature). In some cases, the type of cross-temperature variation may be inferred from the read temperature if there has been an ECC error (e.g., if the read temperature is below a threshold temperature, then it may be inferred that the programming temperature was at a temperature greater than the threshold temperature).

In another embodiment, data may be read from a semiconductor memory and upon detecting an ECC error or a bit error in the read data, the one or more bit errors may be fixed by performing two or more sensing passes with different sensing times and then generating two or more possible data patterns by assigning data states based on the amount of threshold voltage shifting. The two or more possible data patterns may be provided to an ECC engine (or ECC circuit), which may then identify the correct data pattern. For example, the ECC engine may be provided with data patterns covering both hot programming/cold read and cold programming/hot read conditions. A zone shifting threshold (e.g., a shift of three or more zones) may be used to determine if a large shift or small shift has occurred. In one example, two sensing passes with 1.1 us and 2.24 us sensing times may be used to generate two sets of zoned data; two different zone shifting thresholds of 200 mV and 400 mV may be used to generate four possible data patterns from the two sets of zoned data that are then provided to the ECC engine to identify the correct data pattern out of the four data patterns. The order of providing the possible data patterns may be set based on the read temperature (e.g., a lower read temperature may infer a hot programming/cold read condition and a lower read temperature may require a larger zone shifting threshold). One benefit of providing a data pattern with a higher probability of being the correct data pattern to the ECC engine prior to providing another data pattern is that read performance may be improved in the event that the data pattern provided earlier to the ECC engine is indeed the correct data pattern. Once the correct data pattern has been found, the other data patterns (e.g., the other three data patterns out of four data patterns) may not be considered by or transferred to the ECC engine.

A sensing pass may be performed during a read operation (e.g., to determine the stored data state of a memory cell) or during a program verify operation (e.g., to determine whether a memory cell has been programmed to the desired data state). During the sensing pass, a set of sense amplifiers or sensing circuitry may be connected to a set of memory cells being sensed. The sense amplifiers may allow bit lines connected to the memory cells to discharge at a rate dependent on the amount of current discharging through the memory cells or memory cell transistors connected to the bit lines for a sensing time (e.g., 1.1 us or 2.24 us). After the sensing time has occurred, the changes in voltages due to the amount of discharge per bit line may be sampled and/or compared to determine whether the memory cells have threshold voltages greater than a reference voltage (e.g., whether a particular memory cell transistor has a threshold voltage greater than 3V).

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

One architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

No particular non-volatile memory technology is required for purposes of the new embodiments proposed herein. Other examples of suitable technologies for memory cells include ReRAM memory, magnetoresistive memory (e.g., MRAM), phase change memory (e.g., PCM), and the like. One example of a ReRAM or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper) with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. Phase change memory (PCM) may exploit the unique behavior of chalcogenide glass.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor (e.g., an integration capacitor) in a sense amplifier. In another example, the conduction current of the selected memory cell allows (or fails to allow) the NAND string that included the memory cell to discharge a voltage on the corresponding bit line. The voltage of the bit line may be measured after a period of time (e.g., after a sensing time during which the bit line has been discharged) to determine whether the bit line has been discharged by a particular amount or not.

Figure 3B:
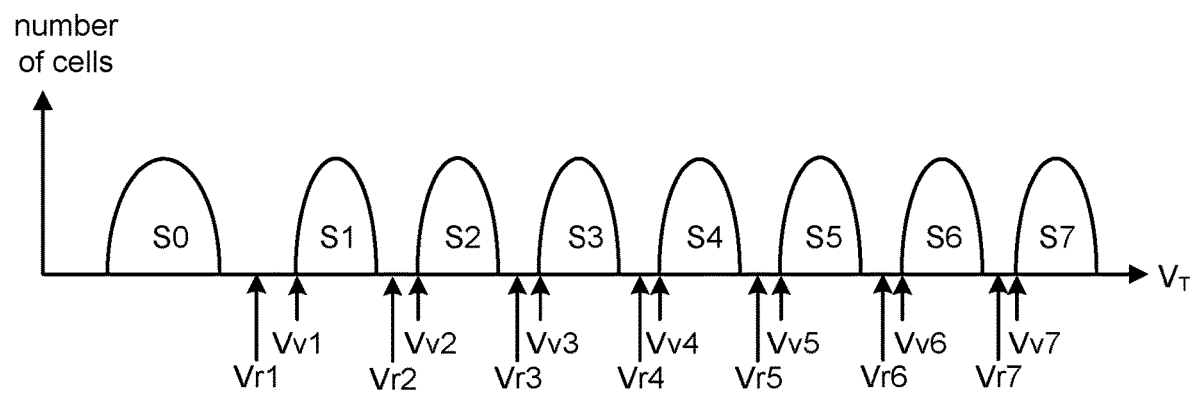
FIG. 3B depicts one embodiment of possible threshold voltage distributions (or data states) for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
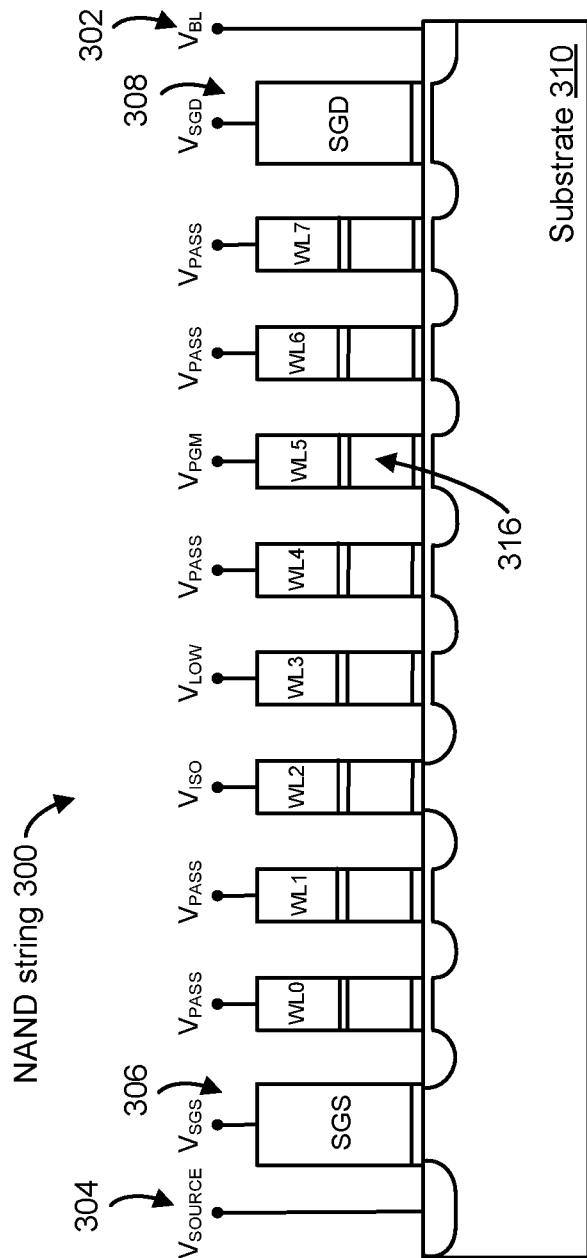
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. $V_{SGS}$ may be applied to the source-side select gate 306 and $V_{SGD}$ may be applied to the drain-side select gate 308. The bit line 302 may be biased to $V_{BA}$ and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

Figure 3D:
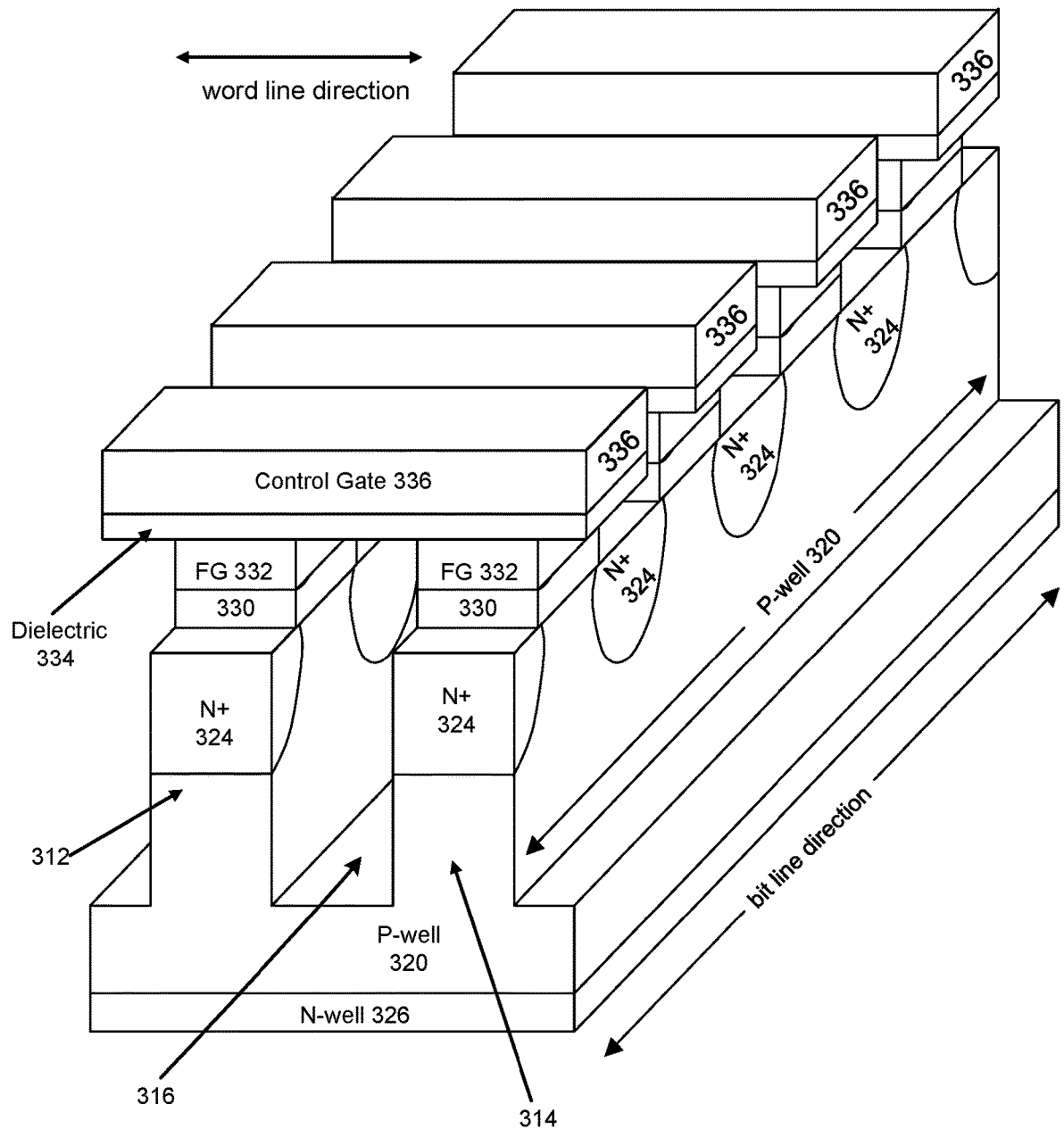
FIG. 3D depicts one embodiment of two NAND strings that may be fabricated as part of a larger flash memory array.

FIG. 3D depicts one embodiment of two NAND strings 312 and 314 that may be fabricated as part of a larger flash memory array. As depicted, NAND strings 312 and 314 each include four memory cells, n-type diffusions 324, and a portion of a shared P-well 320. Each memory cell in a NAND string corresponds with a floating gate 332 isolated by dielectric layers 334 and 330. N-well 326 is below P-well 320. The bit line direction (or y-direction) runs in the direction of the NAND strings, and the word line direction (or x-direction) runs perpendicular to the NAND strings or the bit line direction. The word line direction may be referred to as the row direction and the bit line direction may be referred to as the column direction. In some cases, a bit line associated with a NAND string may run in the bit line direction on top of (or over) the NAND string in a direction perpendicular to the word line direction. In some cases, the N-well 326 may sit in a P-type substrate (not depicted). As depicted, NAND string 312 is separated from NAND string 314 by an isolation region 316. The isolation region 316 may include an insulating material or dielectric between adjacent NAND strings (not depicted). Typically, shallow trench isolation (STI) is used to isolate adjacent NAND strings (e.g., using an active area STI). In one embodiment, the control gates 336 correspond with word lines, such as word lines WL0-WLY of FIG. 3A.

Figure 4A:
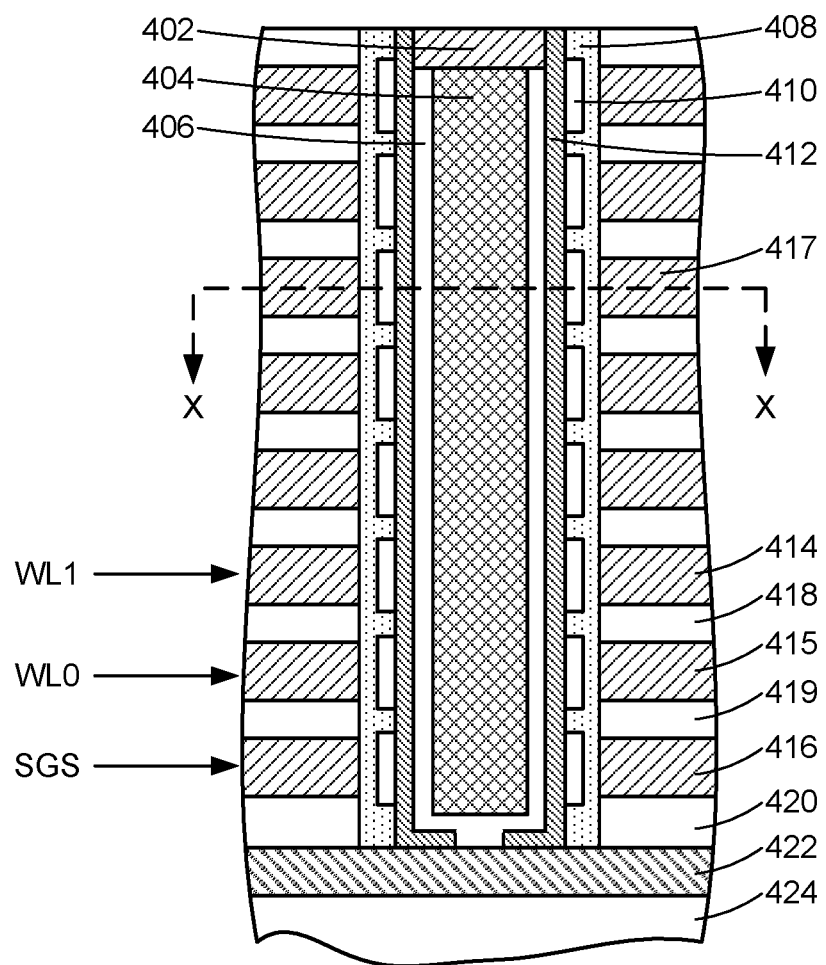
FIG. 4A depicts one embodiment of a vertical NAND structure.

FIG. 4A depicts one embodiment of a vertical NAND structure. The vertical NAND structure includes a vertical NAND string formed above the substrate 424 and oriented such that the vertical NAND string is orthogonal to the substrate 424. The vertical NAND string may be arranged within a vertical memory hole that is etched through alternating layers of control gate material (e.g., tungsten or polysilicon) and inter-gate insulator material (e.g., oxide or silicon oxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a dielectric material 408 (e.g., oxide or a stack of dielectric layers, such as layers of $Al_2O_3$ and $SiO_2$), a floating gate material 410 (e.g., polysilicon), a tunneling layer material 412 (e.g., a thin oxide), and a channel layer material 406 (e.g., undoped polysilicon) may be deposited within the memory hole and arranged in order to form the vertical NAND string. The tunneling layer material 412 may comprise a portion of a multi-layer dielectric stack such as an ONO dielectric stack, which includes alternating layers of silicon dioxide ("O") and silicon nitride ("N"). In some cases, a core material layer 404 (e.g., oxide) may be formed within the memory hole. In other cases, the core material layer 404 may be omitted. A bit line contact layer 402 may be formed at the top of the memory hole and connect to the channel layer material 406. The channel layer material 406 may connect to the source line layer 422 at the bottom of the memory hole. Thus, in this case, the bit line contact layer 402 connects to the vertical NAND string at the top of the memory hole and the source line contact layer 422 connects to the vertical NAND string at the bottom of the memory hole. In some embodiments, the floating gate material 410 may be replaced with a charge storage material or a charge trapping layer (e.g., silicon nitride).

Figure 4B:
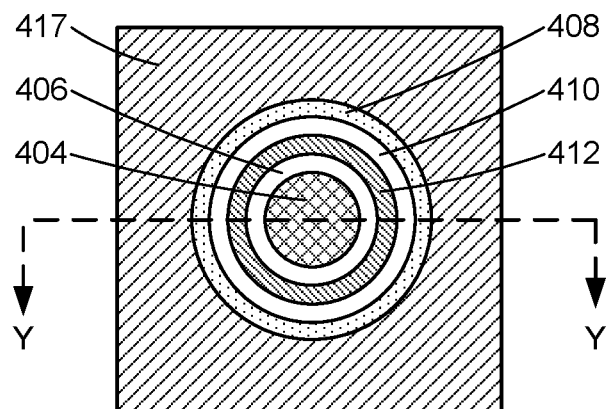
FIG. 4B depicts one embodiment of a cross-sectional view taken along line X-X of FIG. 4A.

FIG. 4B depicts one embodiment of a cross-sectional view taken along line X-X of FIG. 4A. As depicted, the vertical NAND string includes an inner core material layer 404 that is surrounded by the channel layer material 406 that is surrounded by the tunneling layer material 412 that is surrounded by the floating gate material 410 that is surrounded by the dielectric material 408 that is surrounded by the control gate material layer 417. In one embodiment, FIG. 4A may depict a cross-sectional view taken along line Y-Y of FIG. 4B. In one embodiment, the vertical NAND string may be formed using a vertical cylindrical structure or a vertical tapered cylindrical structure. In this case, the dielectric material 408, floating gate material 410, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure.

Figure 5:
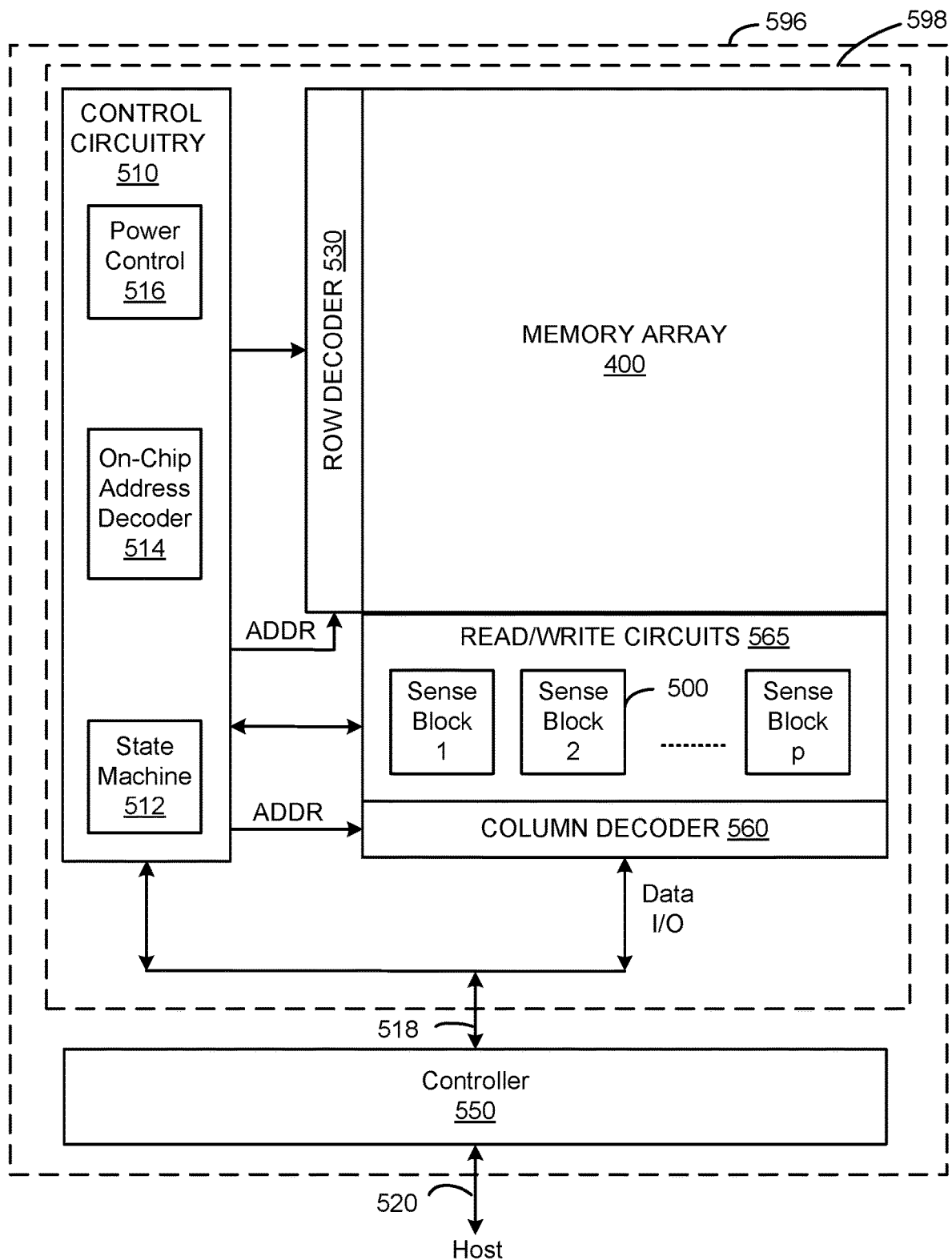
FIG. 5 depicts one embodiment of a non-volatile storage system including read/write circuits for reading and programming a page

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations.

The sense blocks 500 or the read/write circuits 565 may comprise sensing circuits. The sense blocks 500, read/write circuits 565, and/or other sensing circuitry arranged on the memory die 598 may comprise representative examples of means for determining a set of threshold voltage zone data (or a set of threshold voltages) for a plurality of memory cells based on a sensing time. State machines, such as state machine 512, and control circuitry, such as control circuitry 510, may comprise representative examples of means for determining an amount of zone shift between a first set of zone data associated with a first sensing time and a second set of zone data associated with a second sensing time. State machines, such as state machine 512, and control circuitry, such as control circuitry 510, may comprise representative examples of means for determining or assigning data states for a plurality of memory cells based on an amount of zone shifting or an amount of threshold voltage shifting that occurs between two different sensing times.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
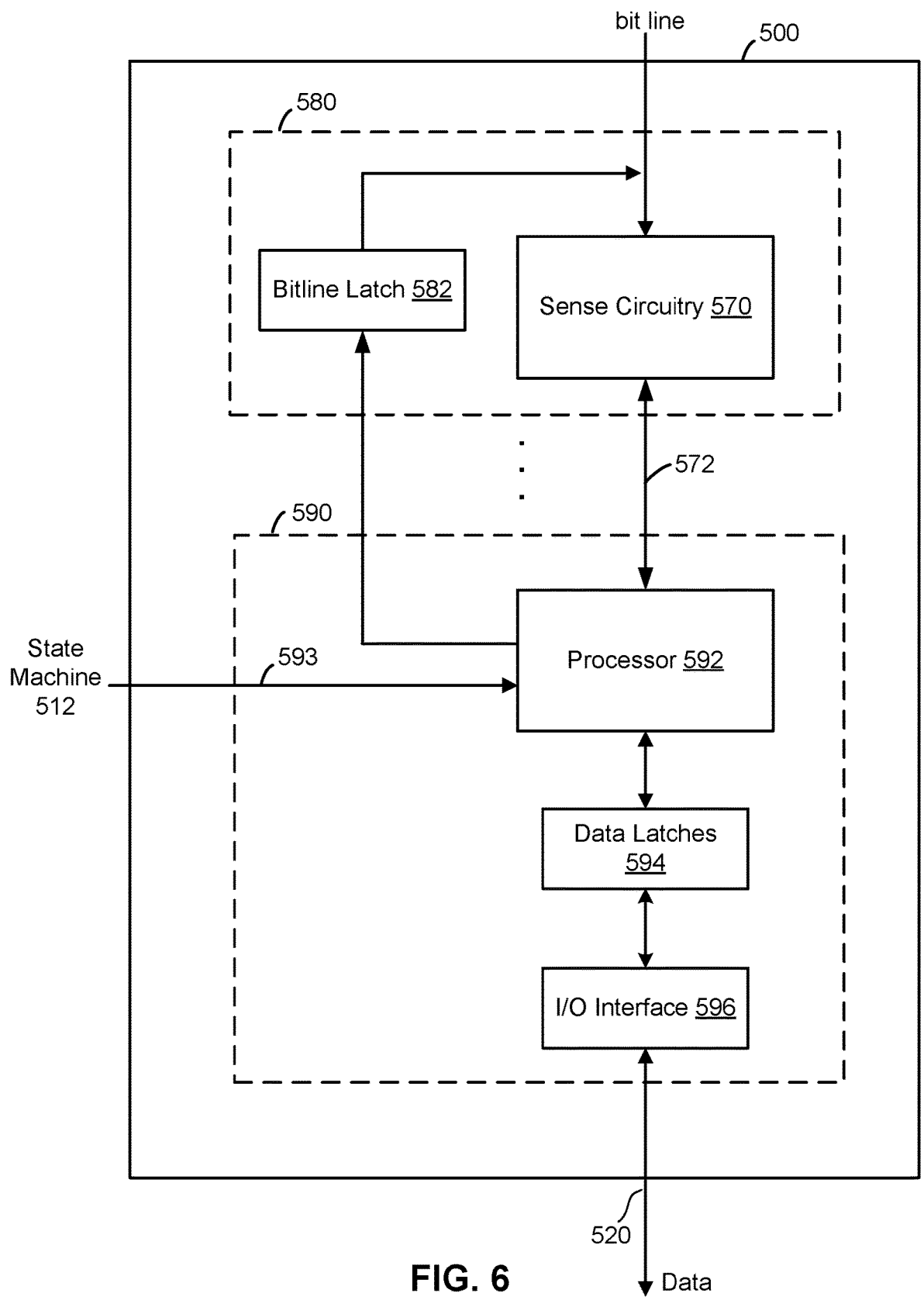
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
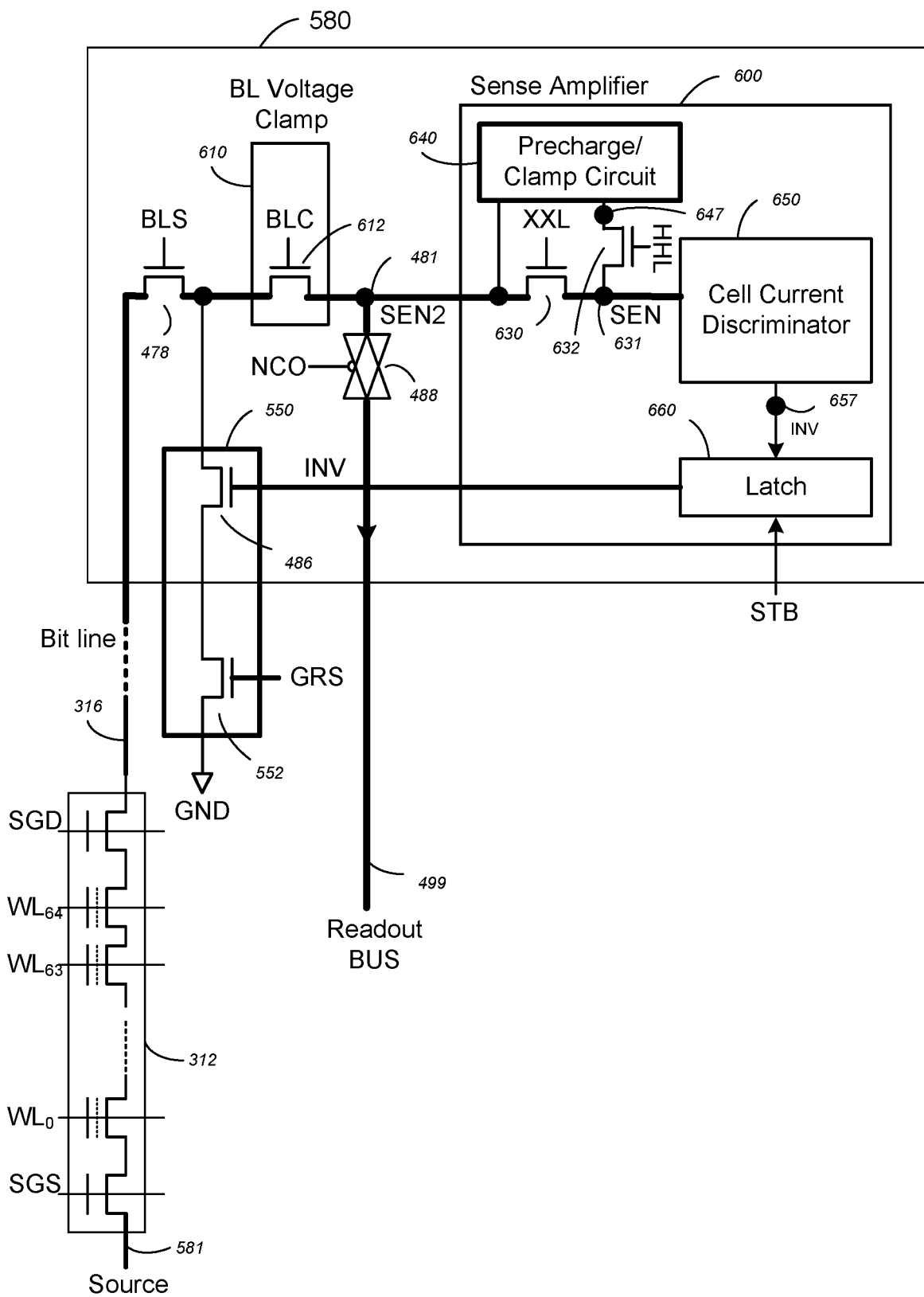
FIG. 7A depicts one embodiment of a sense module.

FIG. 7A depicts one embodiment of a sense module, such as sense module 580 in FIG. 6. As depicted, the sense module may sense the conduction current of a memory cell in a NAND string 312 via a coupled bit line 316. Sense module 580 has a sense node 481 that can be selectively coupled to a bit line, a sense amplifier 600, and a readout bus 499. An isolation transistor 478, when enabled by a signal BLS, connects the bit line 316 to the sense node 481. The sense amplifier 600 senses the sense node 481. Sense amplifier 600 includes a pre-charge/clamp circuit 640, a cell current discriminator 650, and a latch 660. One embodiment of a pre-charge/clamp circuit 640 is described later in reference to FIG. 7B. One embodiment of a cell current discriminator 650 is described later in reference to FIG. 7C.

In one embodiment, sense module 580 controls the voltages and limiting currents applied to bit line 316 and senses the conduction current of a selected memory cell in the NAND string 312. The sense module 580 may include a pull-down circuit 550, which includes transistors 486 and 552, for selectively pulling the bit line 316 to ground. The pull-down circuit 550 is activated when both the signal INV and another signal GRS are both HIGH. The sense module 580 may include a bit line voltage clamp 610, which may clamp the bit line voltage during sensing. Bit line voltage clamp 610 may operate as a source-follower with transistor 612 in series with the bit line 316. BLC may be set to roughly a threshold voltage above the desired bit line voltage (e.g., 0.5V or 0.7V) during sensing. The source 581 of the NAND string 312 may be set to 0V or another bias voltage (e.g., 100 mV) during sensing of the conduction current of the selected memory cell.

Figure 7B:
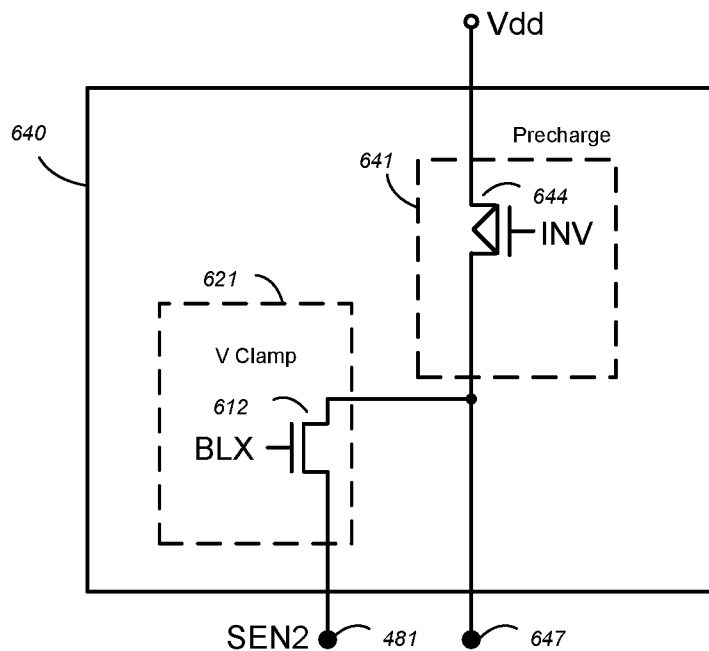
FIG. 7B depicts one embodiment of a pre-charge/clamp circuit.

FIG. 7B depicts one embodiment of a pre-charge/clamp circuit, such as pre-charge/clamp circuit 640 in FIG. 7A. The pre-charge/clamp circuit has a voltage clamp 621 component and a pre-charge circuit 641 component. The voltage clamp 621 is implemented by a transistor 612 controlled by an analog signal BLX at its gate. BLX is such that it ensures sufficient voltage on the node SEN2 481 (see FIG. 7A) so that the bit line voltage clamp 610 can function properly. The pre-charge circuit 641 is implemented by transistor 644 controlled by the signal INV at its gate.

Referring to FIG. 7A, when the selected gate voltage (e.g., a predetermined threshold voltage level) applied to a selected word line is stable, then the conduction current or the programmed threshold voltage of the selected memory cell can be sensed via the coupled bit line 316 via the transistor 630 gated by a signal XXL.

Figure 7C:
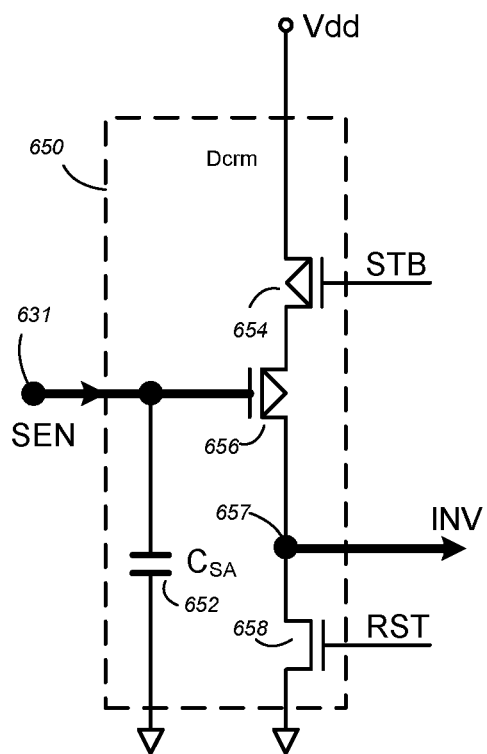
FIG. 7C depicts one embodiment of a cell current discriminator circuit.

FIG. 7C depicts one embodiment of a cell current discriminator circuit, such as cell current discriminator circuit 650 in FIG. 7A. The cell current discriminator 650 serves as a discriminator or comparator of current levels. It is coupled to the sense node to sense the conduction current in the memory cell. Cell current discriminator 650 includes a capacitor 652, p-channel transistor 656, transistors 654 and transistor 658. The cell current discriminator indirectly measures the conduction current of a memory cell by the rate it charges or discharges the capacitor 652. This is accomplished by sensing the signal SEN at the node 631. The signal SEN controls the gate of the p-transistor 656. Prior to sensing, SEN is pre-charged to VDD (HIGH) by the pre-charge circuit 641. Referring to FIG. 7A, the pre-charge is enabled by a signal HHL turning on the coupling transistor 632 so that the node SEN 631 is coupled to the pre-charge circuit 641 at node 647. Sensing is then accomplished by measuring the memory cell's conduction current by the rate it discharges the capacitor 652.

In one embodiment, during sensing, the conduction current of the selected memory cell will discharge the capacitor 652. The voltage of the node SEN will then decrease from VDD at a rate depending on the conduction current. After a predetermined discharging period (or sensing time), SEN will drop to some value that may or may not turn on the measuring p-transistor 656. If it drops sufficiently low to turn on the p-transistor 656, it will mean that the conduction current is higher than the reference current. This will also result in the INV signal being pulled HIGH when the signal STB is asserted. On the other hand, if the transistor 656 is not turned on at the end of the sensing period, the conduction current is lower than the reference current and the signal INV will be LOW. Referring to FIG. 7A, the end of the sensing period is marked by decoupling the bit line from the SEN node with XXL turning off the coupling transistor 630. The sensed result is then latched into the latch 660 based on a strobe signal STB. After the sensed result has been latched, signal NCO may be used to pass the state of the sense node 481 to the readout bus 499 via transfer gate 488.

In another embodiment, a cell current discriminator circuit may include a current mirror, which mirrors the current through the bit line, and a comparator which compares the mirrored current with a reference current. In some cases, a target reference current (or target cell current) may be injected into the bit line in order to facilitate current sensing. In some cases, the cell current discriminator circuit may include a differential amplifier for comparing the voltage associated with a sensed result with a reference voltage and determining the state of a memory cell based on the comparison.

Figure 8A:
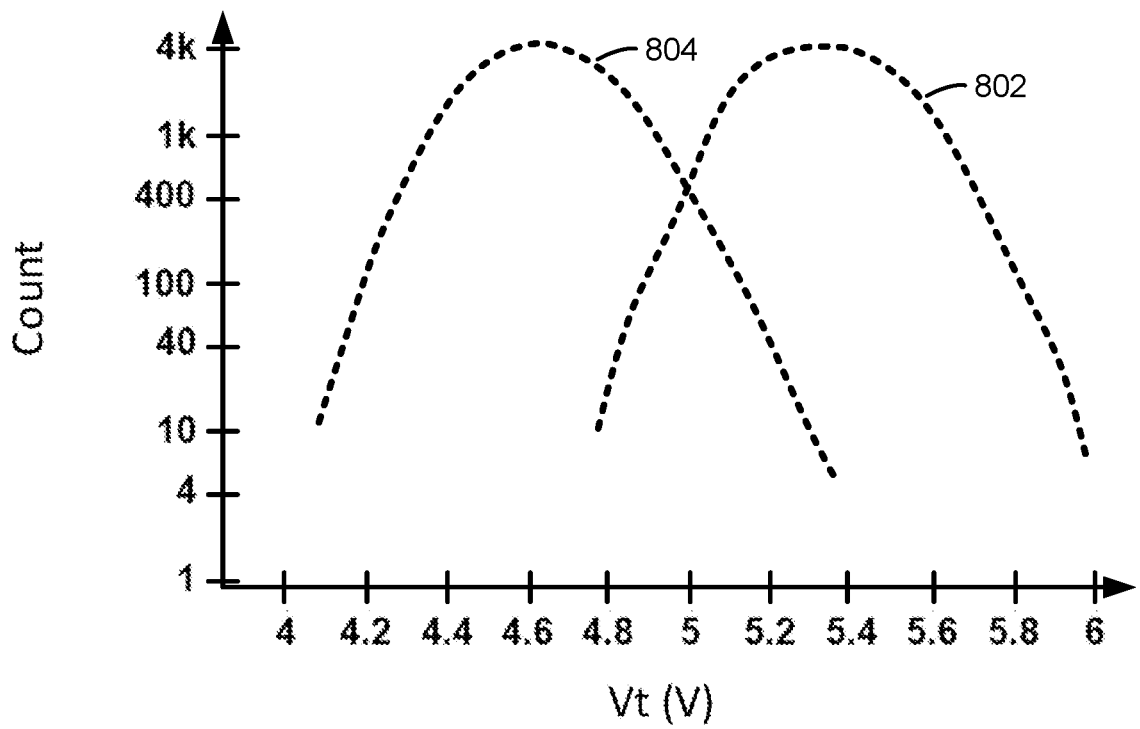
FIG. 8A depicts one embodiment of two threshold voltage distributions corresponding with two different data states.

FIG. 8A depicts one embodiment of two threshold voltage distributions corresponding with two different data states. The number of memory cells (or cell count) is along the vertical axis and the threshold voltage (or Vt) for the memory cells is along the horizontal axis. The first threshold voltage distribution 804 may correspond with a range of threshold voltages between 4V and 5.4V. The second threshold voltage distribution 802 may correspond with a range of threshold voltages between 4.8V and 6V. The first threshold voltage distribution 804 may be associated with a first data state (e.g., the E-state) and the second threshold voltage distribution 802 may be associated with a second data state (e.g., the F-state). As depicted, an overlap in the two distributions occurs between 4.8V and 5.4V.

Figure 8B:
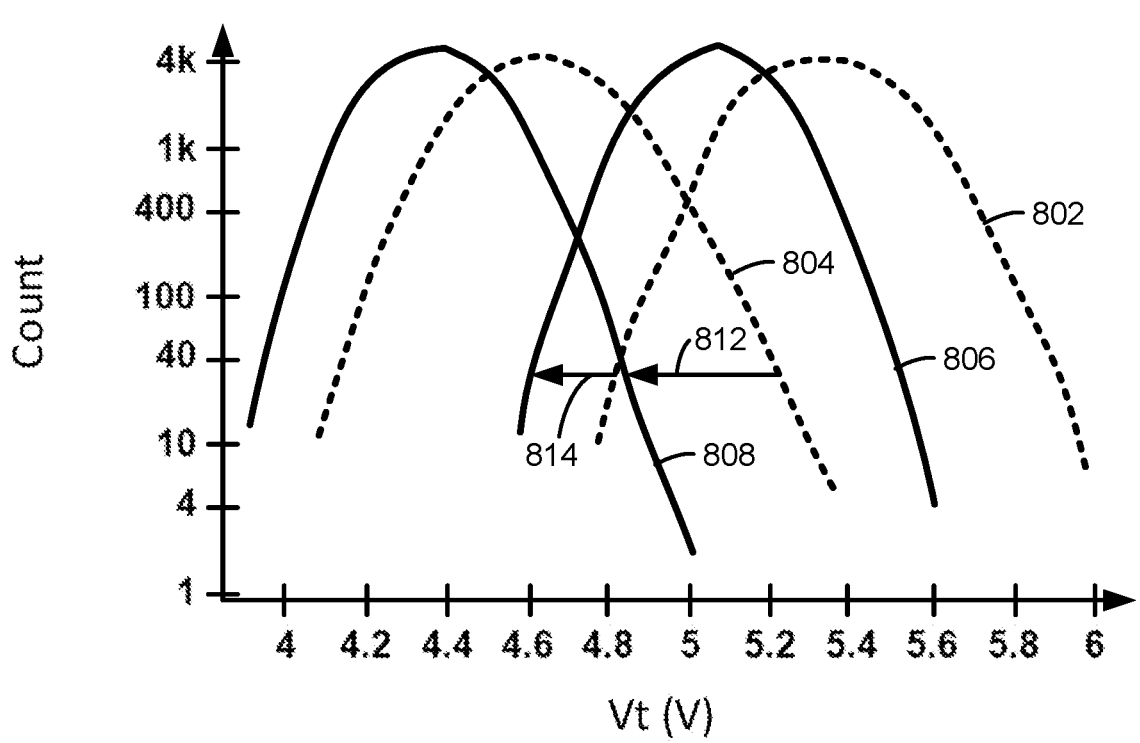
FIG. 8B depicts one embodiment of the shifting in threshold voltage distributions depending on the sensing conditions (e.g., the sensing time and/or the bit line voltage) used for sensing memory cells.

FIG. 8B depicts one embodiment of the shifting in threshold voltage distributions depending on the sensing conditions (e.g., sensing time and/or bit line voltage) used for sensing memory cells. As depicted, a first pair of threshold voltage distributions 802 and 804 associated with a set of memory cells have been shifted towards lower voltages corresponding with a second pair of threshold voltage distributions 806 and 808 due to an increase in the sensing time and/or bit line voltage used for sensing the memory cells. The first pair of threshold voltage distributions 802 and 804 may correspond with two consecutive data states (e.g., the E-state and the F-state) for the memory cells sensed using a first sensing time (e.g., 1.1 us). The second pair of threshold voltage distributions 806 and 808 may correspond with the two consecutive data states (e.g., the E-state and the F-state) for the memory cells sensed using a second sensing time greater than the first sensing time (e.g., 2.24 us). A first threshold voltage shifting 812 between the upper-end of the distribution 804 and the upper-end of the distribution 808 is greater than a second threshold voltage shifting 814 between the lower-end of the distribution 802 and the lower-end of the distribution 806. In this case, the threshold voltage shifting in the higher state distributions corresponding with distributions 802 and 806 is less than that of the lower state distributions corresponding with distributions 804 and 808. In one embodiment, if the shifting in a memory cell's threshold voltage is greater than 200 mV as the sensing time is increased from 1.1 us to 2.24 us, then the memory cell may be deemed to store the lower data state (e.g., the E-state); otherwise, if the shifting in the memory cell's threshold voltage is not greater than 200 mV as the sensing time is increased from 1.1 us to 2.24 us, then the memory cell may be deemed to store the higher data state (e.g., the F-state). In another embodiment, if the shifting in a memory cell's threshold voltage is greater than 150 mV as the bit line voltage is increased from 1.25V to 1.5V, then the memory cell may be deemed to store the lower data state (e.g., the E-state); otherwise, if the shifting in the memory cell's threshold voltage is not greater than 150 mV as the bit line voltage is increased from 1.25V to 1.5V, then the memory cell may be deemed to store the higher data state (e.g., the F-state).

In one embodiment, if a first cross-temperature condition exists (e.g., that the memory cells were programmed at a hot temperature and read-back at a cold temperature less than the hot temperature), then the threshold voltage shifting in higher data state distributions may be less than the threshold voltage shifting in lower data state distributions; however, if a second cross-temperature condition exists (e.g., that the memory cells were programmed at a cold temperature and read-back at a hot temperature greater than the cold temperature), then the threshold voltage shifting in higher data state distributions may be greater than the threshold voltage shifting in lower data state distributions. Thus, the amount of threshold voltage shifting may indicate the presence of a particular cross-temperature condition and the amount of threshold voltage shifting may be used to assign data states for memory cells in which an indeterminate data state is present. In one example, if a memory cell has a sensed threshold voltage of 5.2V when the first sensing time is 1.1 us and a sensed threshold voltage of 4.9V when the second sensing time is 2.24 us, then the memory cell may be assigned to the lower data state (e.g., the E-state) of the overlapping lower and higher data states because the amount of shifting is greater than a threshold amount (e.g., more than 200 mV). In another example, if the memory cell has a sensed threshold voltage of 5.2V when the first sensing time is 1.1 us and a sensed threshold voltage of 5.1V when the second sensing time is 2.24 us, then the memory cell may be assigned to the higher data state (e.g., the F-state) of the overlapping lower and higher data states because the amount of shifting is not greater than the threshold amount (e.g., is less than 200 mV).

If a memory cell is assigned to a first sensed threshold voltage (e.g., 5.2V) when a first sensing time is used (e.g., 1.1 us) and then the same memory cell is assigned to a second sensed threshold voltage (e.g., 4.9) when a second sensing time is used (e.g., 2.24 us), then the amount of shift or the amount of shifting between the first sensed threshold voltage and the second sensed threshold voltage may correspond with the difference between the first sensed threshold voltage and the second sensed threshold voltage. For example, a shift from a first sensed threshold voltage of 5.2V to a second sensed threshold voltage of 4.9V is 300 mV.

Figure 8C:
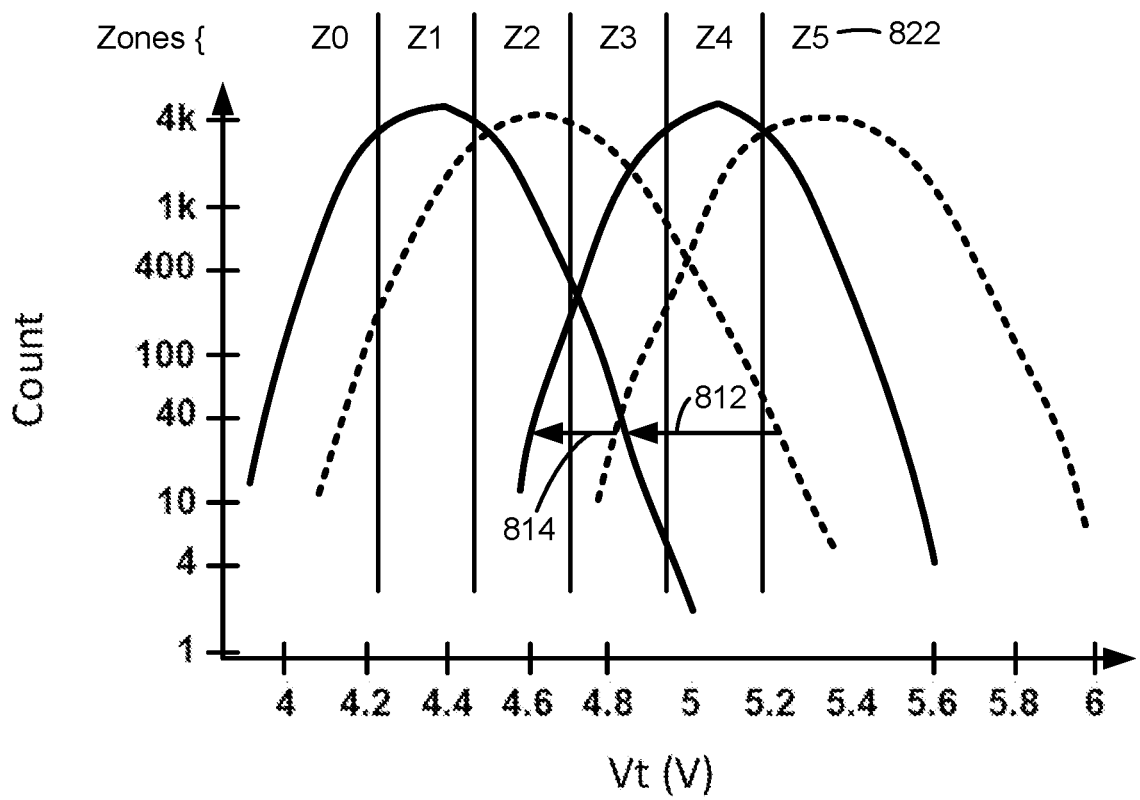
FIG. 8C depicts the threshold voltage distributions of FIG. 8B and six threshold voltage zones comprising zones Z0 through Z5.

FIG. 8C depicts the threshold voltage distributions of FIG. 8B and six threshold voltage zones comprising zones Z0 through Z5. Threshold voltage zone Z5 822 may correspond with threshold voltages greater than or equal to 5.2V, zone Z4 may correspond with threshold voltages between 4.95V and 5.2V, and zone Z0 may correspond with threshold voltages less than or equal to 4.25V. The width of the zones may be set to a uniform range, such as 200 mV or 250 mV. In one embodiment, if a memory cell has a sensed threshold voltage of 5.2V when the first sensing time is 1.1 us, then the memory cell may be assigned to zone Z5 for the first sensing time; if the memory cell has a sensed threshold voltage of 4.9V when the second sensing time is 2.24 us, then the memory cell may be assigned to zone Z3 for the second sensing time. In this case, if the shifting in threshold voltage zones is greater than one zone, then the memory cell may be assigned to the lower data state (e.g., the E-state) of the overlapping lower and higher data states. Otherwise, if the shifting in threshold voltage zones is not more than one zone, then the memory cell may be assigned to the higher data state (e.g., the F-state) of the overlapping lower and higher data states.

If a memory cell is assigned to a first threshold voltage zone (e.g., zone Z5 in FIG. 8C) when a first sensing time is used (e.g., 1.1 us) and then the same memory cell is assigned to a second threshold voltage zone (e.g., zone Z3 in FIG. 8C) when a second sensing time is used (e.g., 2.24 us), then the amount of zone shift or the amount of zone shifting between the first threshold voltage zone and the second threshold voltage zone may correspond with the number of threshold voltage zones between the first threshold voltage zone and the second threshold voltage zone plus one. For example, a shift from zone Z5 to zone Z3 may comprise a two zone shift.

Figure 8D:
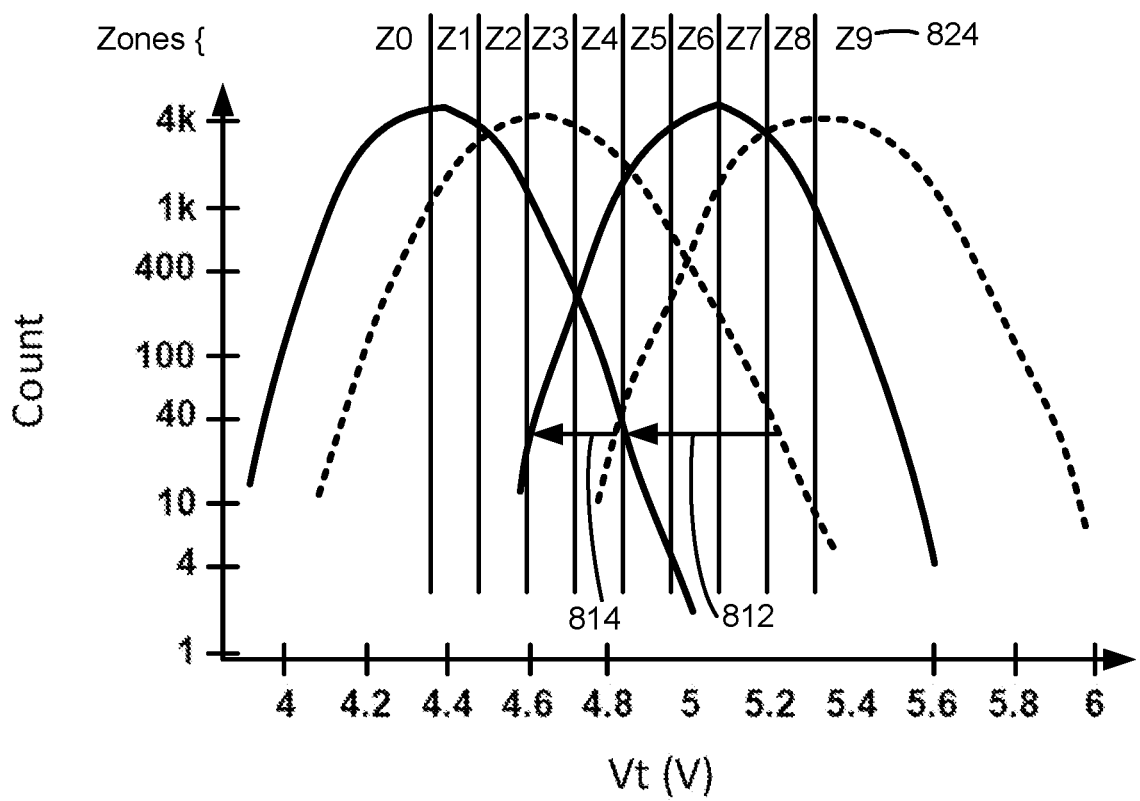
FIG. 8D detects the threshold voltage distributions of FIG. 8B and ten threshold voltage zones comprising zones Z0 through Z9.

FIG. 8D depicts the threshold voltage distributions of FIG. 8B and ten threshold voltage zones comprising zones Z0 through Z9. The number of threshold voltage zones may be increased if the read-back temperature is less than a threshold temperature (e.g., is less than 25 degrees Celsius) or if the read-back temperature is less than the programmed temperature by at least a threshold number of degrees (e.g., the read-back temperature is more than 40 degrees less than the programmed temperature). The width of each zone may be reduced if the read-back temperature is less than a threshold temperature (e.g., the width of each zone may be reduced from 250 mV to 100 mV if the read-back temperature is less than 25 degrees Celsius). In one embodiment, if a memory cell has a sensed threshold voltage of 5.2V when the first sensing time is 1.1 us, then the memory cell may be assigned to zone Z8 for the first sensing time; if the memory cell has a sensed threshold voltage of 4.9V when the second sensing time is 2.24 us, then the memory cell may be assigned to zone Z5 for the second sensing time. In this case, if the shifting in threshold voltage zones is greater than two zones, then the memory cell may be assigned to the lower data state (e.g., the E-state) of the overlapping lower and higher data states. Otherwise, if the shifting in threshold voltage zones is not more than two zones, then the memory cell may be assigned to the higher data state (e.g., the F-state) of the overlapping lower and higher data states.

Figure 9A:
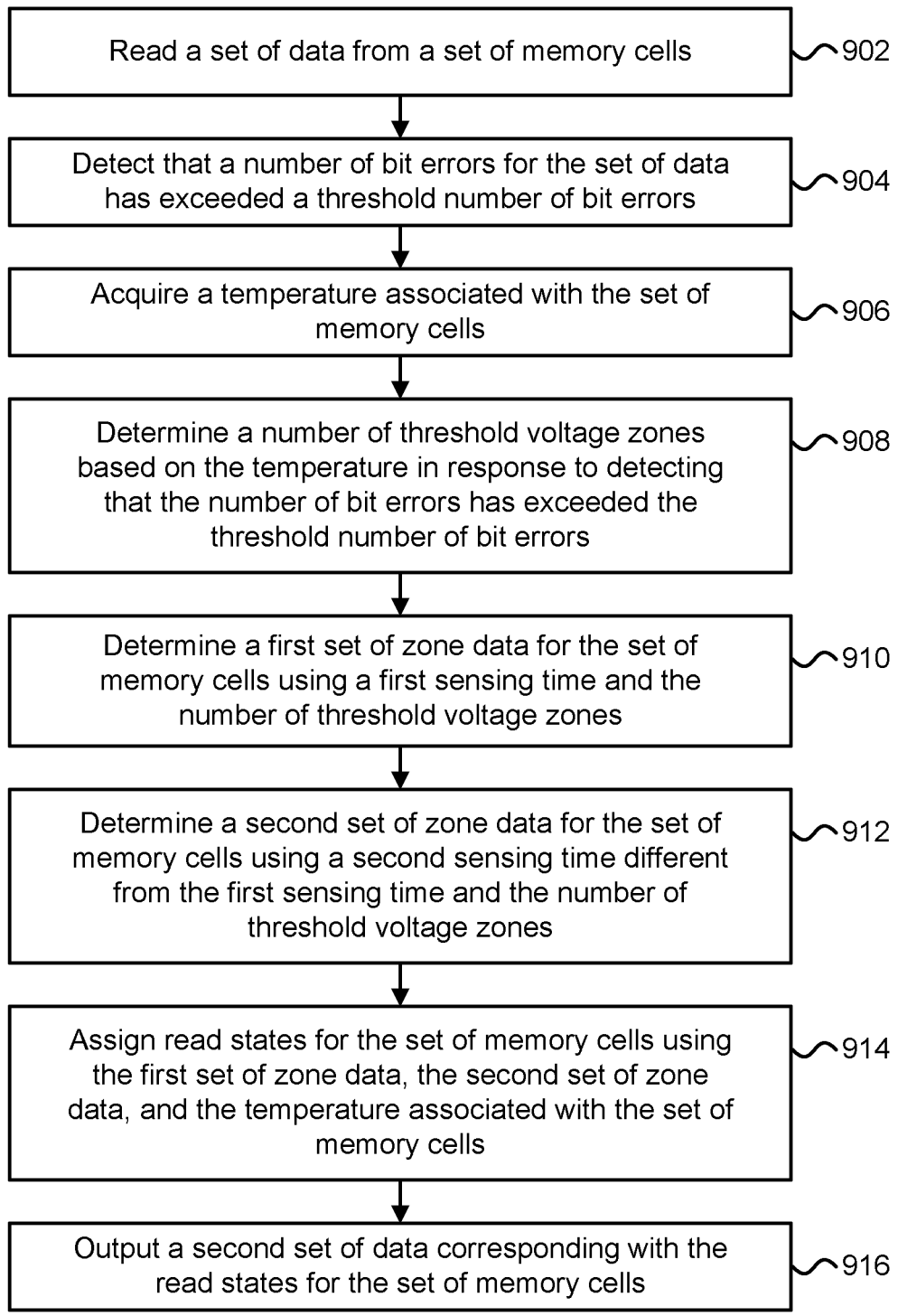
FIG. 9A is a flowchart describing one embodiment of a process for performing a read operation.

FIG. 9A is a flowchart describing one embodiment of a process for performing a sensing operation, such as a read operation. In one embodiment, the process of FIG. 9A may be performed by a non-volatile storage system, such as non-volatile storage system 596 in FIG. 5.

In step 902, a set of data is read from a set of memory cells. The set of memory cells may comprise floating-gate transistors, NAND Flash transistors, or rewritable memory cells. In step 904, it is detected that a number of bit errors for the set of data has exceeded a threshold number of bit errors. The number of bit errors may be detected using error detection and correction circuitry. The threshold number of bit errors may comprise two bit errors. In some cases, if the fail bit count for the set of data exceeds three bit errors, then an additional read process that reads the set of memory cells at two different sensing times (e.g., at 1.1 us and at 2.24 us) may be used to detect an amount of threshold voltage shifting in the sensed threshold voltages for the set of memory cells and assign the memory cells to particular data states based on the amount of threshold voltage shifting. If the read temperature is less than a threshold temperature (e.g., less than 25 degrees Celsius) and the amount of threshold shifting for a particular memory cell is greater than 250 mV, then the data state for the particular memory cell may be assigned to the lower data state of two overlapping data states.

In step 906, a temperature associated with a set of memory cells is acquired. The temperature may be determined via an on-chip temperature sensor. In step 908, a number of threshold voltage zones is determined. The number of threshold voltage zones may be set to a fixed number, such as six zones. In some cases, the number of threshold voltage zones may be set depending on the temperature of the set of memory cells. In one example, if the temperature of the memory cells is greater than a threshold temperature (e.g., is greater than 65 degrees Celsius), then the number of threshold voltage zones may be increased from six zones to ten zones; otherwise, the number of threshold voltage zones may be set to six zones.

In step 910, a first set of zone data for the set of memory cells is determined using a first sensing time and the number of threshold voltage zones. In this case, each memory cell of the set of memory cells may be sensed using the first sensing time and a particular zone (e.g., zone Z3 or zone Z4 out of the ten zones in FIG. 8D) of the zones may be assigned to each of the memory cells. In step 912, a second set of zone data for the set of memory cells is determined using a second sensing time different from the first sensing time and the number of threshold voltage zones. In this case, each memory cell of the set of memory cells may be sensed using the second sensing time and a particular zone (e.g., zone Z1 or zone Z2 out of the ten zones in FIG. 8D) of the zones may be assigned to each of the memory cells.

In some embodiments, the first set of zone data for the set of memory cells may be determined using a first set of sensing conditions (e.g., a first bit line voltage or a first sensing time) and the number of threshold voltage zones. For example, each memory cell of the set of memory cells may be sensed using the first sensing time and/or a first bit line voltage to determine the first set of zone data. The second set of zone data for the set of memory cells may be determined using a second set of sensing conditions (e.g., a second bit line voltage or a second sensing time) and the number of threshold voltage zones. For example, each memory cell of the set of memory cells may be sensed using the second sensing time and/or a second bit line voltage to determine the second set of zone data.

In step 914, read states for the set of memory cells are assigned using the first set of zone data, the second set of zone data, and the temperature associated with the set of memory cells. In one embodiment, if the temperature associated with the set of memory cells is below a lower bound (e.g., the chip temperature is less than 25 degrees Celsius), then a hot programming/cold read cross-temperature condition may be assumed and indeterminate data states may be assigned to lower data states if the amount of threshold voltage zone shifting is greater than a threshold amount (e.g., is greater than 250 mV) or to higher data states if the amount of threshold voltage zone shifting is not greater than the threshold amount. In one example, if a first memory cell of the set of memory cells has an indeterminate data state due to being assigned zones that exists within an overlap between two adjacent data states, then the determination of whether the first memory cell should be assigned the lower data state or the higher data state may depend on the read-back temperature. In step 916, a second set of data corresponding with the read states for the set of memory cells is outputted. The second set of data may comprise a corrected set of data different from the set of data that exceeded the threshold number of bit errors in step 904. The second set of data may be transferred to error detection and correction circuitry in order to confirm that the second set of data is valid data.

Figure 9B:
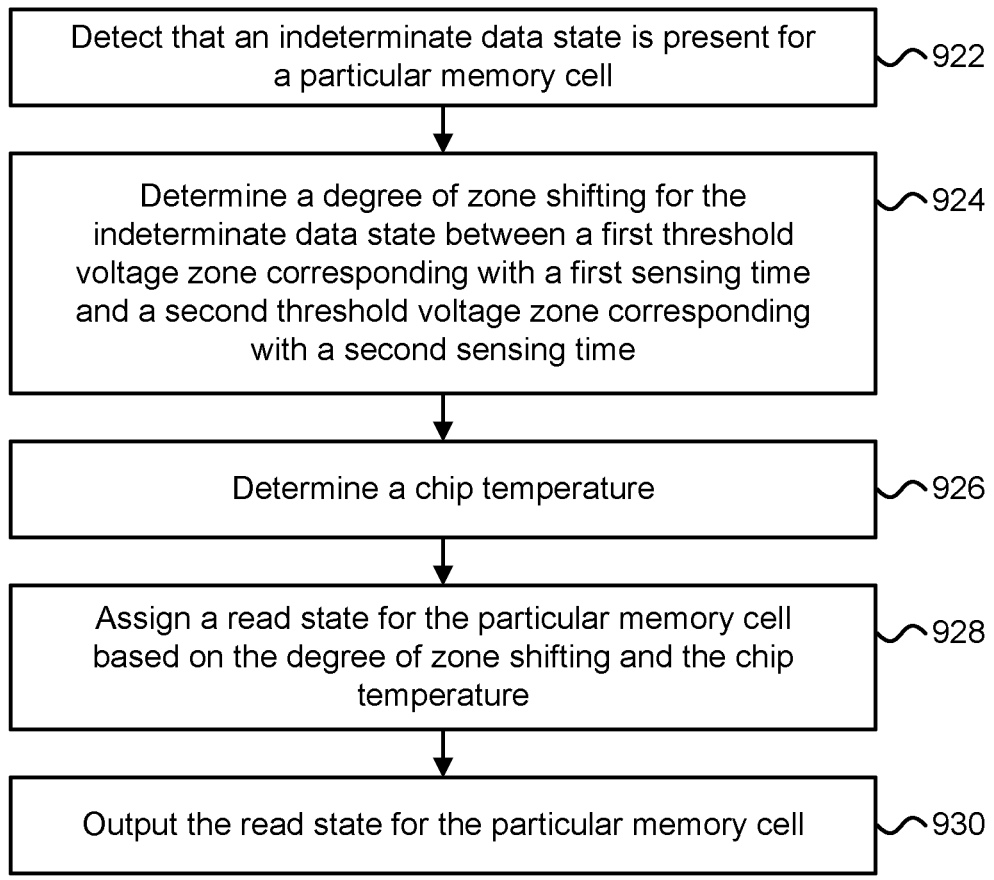
FIG. 9B is a flowchart describing one embodiment of a process for assigning a read state to a memory cell.

FIG. 9B is a flowchart describing one embodiment of a process for assigning a read state to a memory cell. The process described in FIG. 9B is one example of a process for implementing step 914 in FIG. 9A. In one embodiment, the process of FIG. 9B may be performed by a non-volatile storage system, such as non-volatile storage system 596 in FIG. 5.

In step 922, it is detected that an indeterminate data state is present for a particular memory cell. It may be detected that an indeterminate data state is present if a first threshold voltage zone associated with a first sensing time comprises an overlap zone shared by two adjacent data states and a second threshold voltage zone associated with a second sensing time also comprises an overlap zone shared by the two adjacent data states. Referring to FIG. 8C, zones Z3, Z4, and Z5 comprise overlap zones for the distributions 804 and 802. In step 924, a degree of zone shifting for the indeterminate data state between a first threshold voltage zone corresponding with the first sensing time and a second threshold voltage zone corresponding with a second sensing time is determined. The degree of zone shifting may comprise the number of zones between the first threshold voltage zone and the second threshold voltage zone. In step 926, a chip temperature is determined. In step 928, a read state for the particular memory cell is assigned based on the degree of zone shifting and the chip temperature. In step 930, the read state for the particular memory cell is output. The read state may comprise the lower data state (e.g., the E-state) of two overlapping data states if the chip temperature is less than 25 degrees Celsius or may comprise the higher data state (e.g., the F-state) of the two overlapping data states if the chip temperature is greater than 65 degrees Celsius.

Figure 9C:
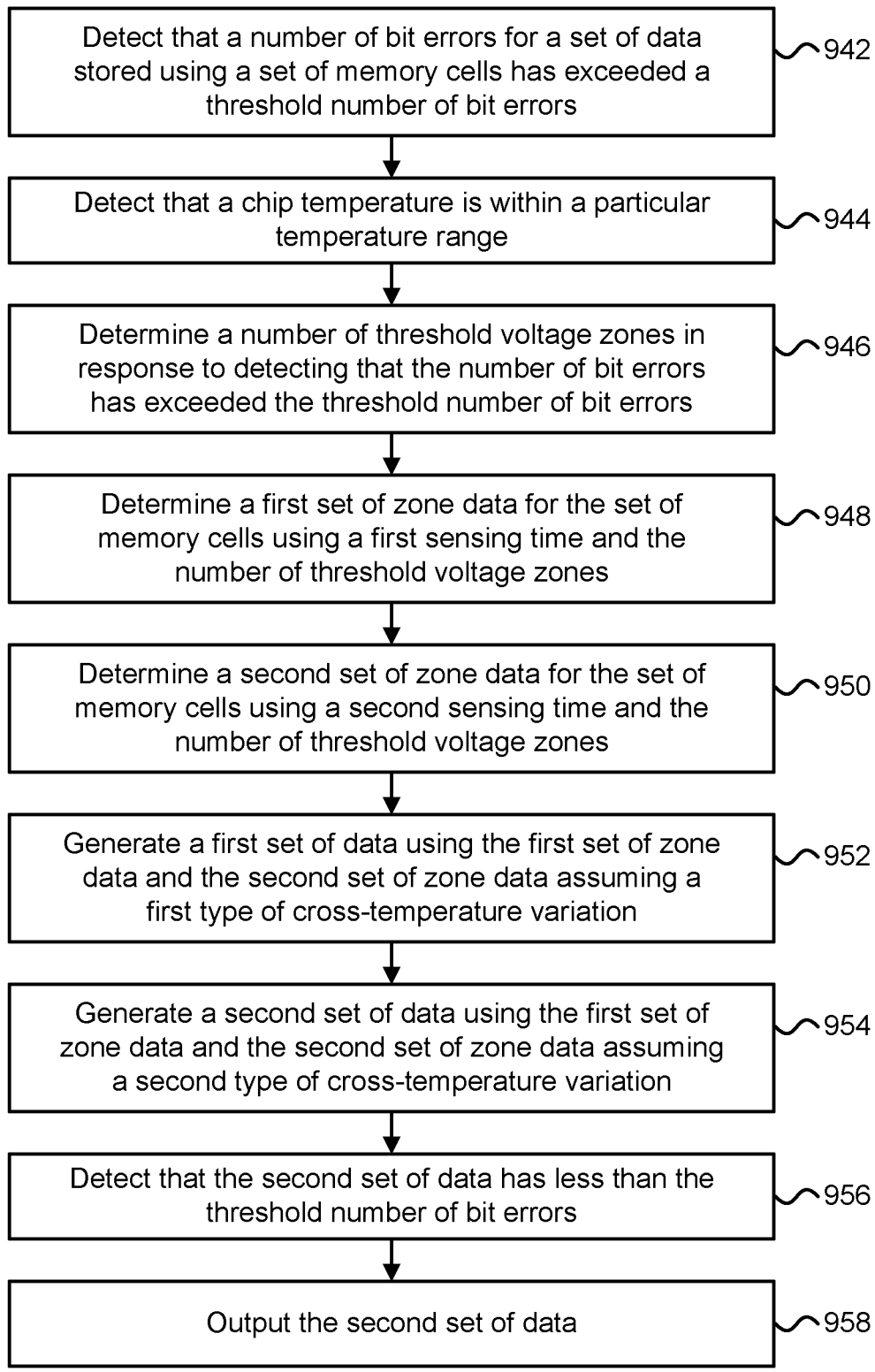
FIG. 9C is a flowchart describing another embodiment of a process for performing a read operation.

FIG. 9C is a flowchart describing another embodiment of a process for performing a read operation. In one embodiment, the process of FIG. 9C may be performed by a non-volatile storage system, such as non-volatile storage system 596 in FIG. 5.

In step 942, it is detected that a number of bit errors for a set of data stored using a set of memory cells has exceeded a threshold number of bit errors. The set of data may be read from the set of memory cells and error detection and/or correction circuitry may be used to determine whether the set of data has exceeded the threshold number of bit errors. In step 944, it is detected that a chip temperature is within a particular temperature range. In one example, it may be detected that the chip temperature is between 25 degrees Celsius and 65 degrees Celsius. In step 946, a number of threshold voltage zones is determined. In one embodiment, the number of threshold voltage zones may be determined based on the chip temperature. For example, if the chip temperature is less than 25 degrees Celsius, then ten zones may be used; otherwise, if the chip temperature is not less than 25 degrees Celsius, then six zones may be used.

In step 948, a first set of zone data for the set of memory cells is determined using a first sensing time and the number of threshold voltage zones. In step 950, a second set of zone data for the set of memory cells is determined using a second sensing time and the number of threshold voltage zones. The first set of zone data may comprise an identification of sensed threshold voltage zones for each of the set of memory cells. In one example, the first sensing time may comprise 1.1 us and the second sensing time may comprise 2.24 us. In step 952, a first set of data is generated using the first set of zone data and the second set of zone data assuming a first type of cross-temperature variation. In step 954, a second set of data is generated using the first set of zone data and the second set of zone data assuming a second type of cross-temperature variation different from the first type of cross-temperature variation. In one example, the first type of cross-temperature variation may comprise a hot programming/cold read condition and the second type of cross-temperature variation may comprise a cold programming/hot read condition.

Both the first set of data and the second set of data may be provided to an error detection and correction circuit in order to determine whether the first set of data or the second set of data is correct or whether the first set of data or the second set of data comprises no bit errors or the fewest number of bit errors. In step 956, it is detected that the second set of data has less than the threshold number of bit errors. In step 958, the second set of data is outputted. In this case, the error detection and correction circuit may determine that the first set of data is not the correct data pattern and that the second set of data is the correct data pattern as the number of bit errors for the second set of data is zero.

One embodiment of the disclosed technology includes a plurality of memory cells, a temperature sensor configured to determine a temperature associated with the plurality of memory cells, and a sensing circuit configured to determine a first set of zone data for the plurality of memory cells based on a first sensing time and determine a second set of zone data for the plurality of memory cells based on a second sensing time different from the first sensing time. The sensing circuit configured to determine an amount of zone shift between the first set of zone data and the second set of zone data and assign data states for the plurality of memory cells based on the amount of zone shift, the sensing circuit configured to output the data states for the plurality of memory cells.

One embodiment of the disclosed technology includes a plurality of memory cells, a temperature sensor configured to determine a temperature associated with the plurality of memory cells, and a sensing circuit configured to determine a first set of zone data for the plurality of memory cells based on a first sensing time and determine a second set of zone data for the plurality of memory cells based on a second sensing time different from the first sensing time. The sensing circuit configured to determine an amount of zone shifting between the first set of zone data and the second set of zone data and assign data states for the plurality of memory cells based on the temperature associated with the plurality of memory cells and the amount of zone shifting. The sensing circuit configured to output the data states for the plurality of memory cells.

One embodiment of the disclosed technology includes a set of memory cells and one or more control circuits in communication with the set of memory cells. The one or more control circuits configured to determine a temperature associated with the set of memory cells. The one or more control circuits configured to determine a first set of threshold voltage data for the set of memory cells based on a first sensing time and determine a second set of threshold voltage data for the set of memory cells based on a second sensing time different from the first sensing time. The one or more control circuits configured to determine an amount of threshold voltage shift between the first set of threshold voltage data and the second set of threshold voltage data and assign read states for the set of memory cells based on the amount of threshold voltage shift between the first set of threshold voltage data. The one or more control circuits configured to output a second set of data corresponding with the read states for the set of memory cells.

One embodiment of the disclosed technology includes a set of memory cells, an error correction circuit, a temperature sensor configured to determine a temperature associated with the set of memory cells, and a sensing circuit configured to determine a first set of threshold voltage zone data for the set of memory cells based on a first sensing time and determine a second set of threshold voltage zone data for the set of memory cells based on a second sensing time different from the first sensing time. The sensing circuit configured to generate a first set of data using the first set of threshold voltage zone data and the second set of threshold voltage zone data assuming a first type of cross-temperature variation and generate a second set of data using the first set of threshold voltage zone data and the second set of threshold voltage zone data assuming a second type of cross-temperature variation different from the first type of cross-temperature variation. The error correction circuit configured to acquire the first set of data and the second set of data. The error correction circuit configured to detect that the second set of data has less than a threshold number of bit errors and output the second set of data in response to detection that that the second set of data has less than a threshold number of bit errors.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
  a set of memory cells; and
  one or more control circuits in communication with the set of memory cells, the one or more control circuits configured to perform a read operation comprising a determination of a first set of threshold voltage data for the set of memory cells using a first set of sensing conditions and a determination of a second set of threshold voltage data for the set of memory cells using a second set of sensing conditions different from the first set of sensing conditions, the one or more control circuits configured to perform the read operation comprising a determination of an amount of threshold voltage shift between the first set of threshold voltage data and the second set of threshold voltage data and an assignment of read states for the set of memory cells based on the amount of threshold voltage shift between the first set of threshold voltage data and the second set of threshold voltage data, the one or more control circuits configured to output a second set of data corresponding with the read states for the set of memory cells.

2. The apparatus of claim 1, wherein:
  the first set of sensing conditions comprises application of a first sensing time and the second set of sensing conditions comprises application of a second sensing time different from the first sensing time.

3. The apparatus of claim 2, wherein:
  the one or more control circuits configured to determine a temperature associated with the set of memory cells and determine a number of threshold voltage zones based on the temperature, the one or more control circuits configured to determine a first set of zone data for the set of memory cells based on the first sensing time and the number of threshold voltage zones and determine a second set of zone data for the set of memory cells based on the second sensing time and the number of threshold voltage zones, the one or more control circuits configured to determine an amount of zone shift between the first set of zone data and the second set of zone data and assign the read states for the set of memory cells based on the temperature and the amount of zone shift.

4. The apparatus of claim 2, wherein:
  the one or more control circuits configured to detect that an indeterminate data state is present for a particular memory cell of the set of memory cells and determine a degree of zone shifting for the indeterminate data state between a first threshold voltage zone for the particular memory cell corresponding with the first sensing time and a second threshold voltage zone for the particular memory cell corresponding with the second sensing time.

5. The apparatus of claim 4, wherein:
  the one or more control circuits configured to assign a particular read state for the particular memory cell based on the degree of zone shifting, the one or more control circuits configured to detect that the degree of zone shifting is greater than a shifting threshold and assign the particular read state for the particular memory cell based on the temperature in response to detection that the degree of shifting is greater than the shifting threshold.

6. The apparatus of claim 1, wherein:
  the one or more control circuits configured to identify a cross-temperature condition and assign the read states for the set of memory cells based on the cross-temperature condition.

7. The apparatus of claim 6, wherein:
  the cross-temperature condition corresponds with the set of memory cells being programmed at a high temperature and read back at a cold temperature less than the high temperature.

8. The apparatus of claim 1, wherein:
  the one or more control circuits configured to read a set of data from the set of memory cells and detect that a number of bit errors for the set of data has exceeded a threshold number of bit errors, the one or more control circuits configured to determine the amount of threshold voltage shift between the first set of threshold voltage data and the second set of threshold voltage data in response to detection that the number of bit errors has exceeded the threshold number of bit errors.

9. An apparatus, comprising:
  a plurality of memory cells; and
  a sensing circuit configured to perform a read operation comprising a determination of a first set of zone data for the plurality of memory cells based on a first set of sensing conditions and a determination of a second set of zone data for the plurality of memory cells based on a second set of sensing conditions different from the first set of sensing conditions, the sensing circuit configured to perform the read operation comprising a determination of an amount of zone shift between the first set of zone data and the second set of zone data and an assignment of data states for the plurality of memory cells based on the amount of zone shift between the first set of zone data and the second set of zone data, the sensing circuit configured to output the data states for the plurality of memory cells.

10. The apparatus of claim 9, further comprising:
  a temperature sensor configured to determine a temperature associated with the plurality of memory cells, the sensing circuit configured to assign the data states for the plurality of memory cells based on the temperature and the amount of zone shift.

11. The apparatus of claim 10, wherein:
  the sensing circuit configured to detect that an indeterminate data state is present for a particular memory cell of the plurality of memory cells and determine a degree of zone shifting for the indeterminate data state between a first threshold voltage zone for the particular memory cell corresponding with the first set of sensing conditions and a second threshold voltage zone for the particular memory cell corresponding with the second set of sensing conditions, the sensing circuit configured to assign a particular data state for the particular memory cell based on the degree of zone shifting and the temperature, the first threshold voltage zone corresponds with a first range of threshold voltages and the second threshold voltage zone corresponds with a second range of threshold voltages different from the first range of threshold voltages.

12. The apparatus of claim 11, wherein:
the indeterminate data state is associated with an overlap between a first data state distribution corresponding with the first range of threshold voltages and a second data state distribution corresponding with the second range of threshold voltages that is shifted higher than the first data state distribution; and
the sensing circuit configured to detect that the degree of zone shifting is greater than a threshold number of zones and assign the particular data state to the first data state distribution in response to detection that the degree of zone shifting is greater than the threshold number of zones.

13. The apparatus of claim 9, wherein:
the sensing circuit configured to detect that the amount of zone shifting is greater than a shifting threshold and assign a particular data state for a particular memory cell of the plurality of memory cells in response to detection that the amount of zone shifting is greater than the shifting threshold.

14. The apparatus of claim 10, wherein:
the sensing circuit configured to determine a number of threshold voltage zones for the plurality of memory cells based on the temperature; and
the first set of sensing conditions comprises application of a first sensing time to the plurality of memory cells and the second set of sensing conditions comprises application of a second sensing time different from the first sensing time to the plurality of memory cells.

15. The apparatus of claim 10, wherein:
the sensing circuit configured to read a set of data from the plurality of memory cells and detect that a number of bit errors for the set of data has exceeded a threshold number of bit errors, the sensing circuit configured to assign the data states for the plurality of memory cells based on the temperature and the amount of zone shifting in response to detection that the number of bit errors has exceeded the threshold number of bit errors.

16. The apparatus of claim 15, wherein:
the plurality of memory cells comprises one of a plurality of floating-gate transistors or a plurality of charge trap transistors; and
the sensing circuit configured to determine programming temperature information for the set of memory cells and based on the programming temperature information determine that the set of memory cells were programmed at a temperature greater than the temperature associated with the plurality of memory cells in response to detection that the temperature associated with the plurality of memory cells is less than the programming temperature information.

17. An apparatus, comprising:
a set of memory cells;
a temperature sensor configured to determine a temperature associated with the set of memory cells;
a sensing circuit configured to determine a first set of threshold voltage zone data for the set of memory cells based on a first sensing time and determine a second set of threshold voltage zone data for the set of memory cells based on a second sensing time different from the first sensing time, the sensing circuit configured to generate a first set of data using the first set of threshold voltage zone data and the second set of threshold voltage zone data assuming a first type of cross-temperature variation and generate a second set of data using the first set of threshold voltage zone data and the second set of threshold voltage zone data assuming a second type of cross-temperature variation different from the first type of cross-temperature variation; and
an error detection circuit configured to acquire the first set of data and the second set of data, the error detection circuit configured to detect that the second set of data has less than a threshold number of bit errors and output the second set of data in response to detection that that the second set of data has less than the threshold number of bit errors.

18. The apparatus of claim 17, wherein:
the error detection circuit configured to determine that the second set of data has fewer bit errors than the first set of data and output the second set of data in response to the determination that the second set of data has fewer bit errors than the first set of data.

19. The apparatus of claim 17, wherein:
the sensing circuit configured to determine an order for transmitting data to the error detection circuit based on the temperature and transfer the second set of data to the error detection circuit prior to transmission of the first set of data to the error detection circuit based on the order.

20. The apparatus of claim 17, wherein:
the set of memory cells comprises one of a set of floating-gate transistors or a set of charge trap transistors; and
the sensing circuit is arranged on a memory die and the error detection circuit is arranged outside of the memory die, the sensing circuit configured to acquire programming temperature information for the set of memory cells and infer that the first type of cross-temperature variation corresponds with the set of memory cells being programmed at a high temperature and read back at a cold temperature less than the high temperature and on the programming temperature information.

* * * * *